(12) United States Patent
Lentz et al.

(10) Patent No.: US 11,474,130 B2
(45) Date of Patent: Oct. 18, 2022

(54) VOLTAGE GLITCH DETECTION IN INTEGRATED CIRCUIT

(71) Applicant: NXP B.V., Eindhoven (NL)

(72) Inventors: Andreas Lentz, Buchholz (DE); Andreas Bernardus Maria Jansman, Nuenen (NL)

(73) Assignee: NXP B.V., Eindhoven (NL)

( * ) Notice: Subject to any disclaimer, the term of this patent is extended or adjusted under 35 U.S.C. 154(b) by 236 days.

(21) Appl. No.: 16/908,338

(22) Filed: Jun. 22, 2020

(65) Prior Publication Data

US 2021/0396789 A1 Dec. 23, 2021

(51) Int. Cl.
*G01R 19/165* (2006.01)
*G06K 19/073* (2006.01)
*H03K 5/1252* (2006.01)

(52) U.S. Cl.
CPC .. *G01R 19/16538* (2013.01); *G06K 19/07363* (2013.01); *H03K 5/1252* (2013.01)

(58) Field of Classification Search
CPC ........ H03K 5/2481; H03K 5/249; H03K 5/08; H03K 5/24; G01R 19/16519
USPC .......................................................... 327/77
See application file for complete search history.

(56) References Cited

U.S. PATENT DOCUMENTS

| | | | | |
|---|---|---|---|---|
| 6,069,536 A | * | 5/2000 | Oh .................. | H03K 3/0322 331/34 |
| 6,424,189 B1 | * | 7/2002 | Su ..................... | H04L 7/02 327/145 |
| 2008/0094053 A1 | * | 4/2008 | Han ................. | G01R 31/31727 324/76.39 |
| 2017/0032125 A1 | * | 2/2017 | Lee ................... | G08B 21/18 |
| 2020/0402602 A1 | | 12/2020 | Mahatme et al. | |

FOREIGN PATENT DOCUMENTS

| | | |
|---|---|---|
| TW | 201512684 A | 4/2015 |
| WO | 2014190666 A1 | 12/2014 |
| WO | 2015006036 A1 | 1/2015 |

OTHER PUBLICATIONS

Andreas Lentz, "Fully Digital Glitch Detection Mechanism With Process and Temperature Compensation," U.S. Appl. No. 16/445,650, filed Jun. 19, 2019, 39 pages.
Dennis Gnad, "An Experimental Evaluation and Analysis of Transient Voltage Fluctuations in FPGAs," IEEE Trans. on Very Large Scale Integration (VLSI) Systems, vol. 26, No. 10, Oct. 2018, p. 1817-1830, 14 pages.
Kenneth Zick, "Sensing Nanosecond-Scale Voltage Attacks and Natural Transients in FPGAs," FPGA '13, Feb. 11-13, 2013, p. 101-104, 4 pages.
Kinger, Bhawika et al.; "Design of Improved Performance Voltage Controlled Ring Oscillator;" 2015 Fifth International Conference on Advanced Computing & Communication Technologies, Feb. 21-22, 2015, 5 pages.
U.S. Appl. No. 17/189,329, filed Mar. 2, 2021, 27 pages.

\* cited by examiner

*Primary Examiner* — Quan Tra

(57) ABSTRACT

An integrated circuit for hardware security comprises a voltage glitch detection processing system comprising an oscillator circuit that generates and outputs a local oscillator clock which is a function of a supply voltage; a counter clocked by the oscillator circuit to generate at least one count value; and a capture section that synchronizes the at least one count value into a system clock domain for detecting a voltage glitch in the supply voltage.

20 Claims, 7 Drawing Sheets

VOLTAGE GLITCH DETECTION IN INTEGRATED CIRCUIT

FIELD

The present disclosure relates generally to security protection in data processing systems, and more specifically to supply voltage glitch detection technology for protecting against fault attacks in a device comprising integrated circuits.

BACKGROUND

Data processing systems, such as automotive controller chips, set-top box systems, chip cards, and other System-on-Chip (SoC) circuits, are increasingly prone to supply voltage glitch attacks, for example, which can include positive or negative voltage glitches to reach or process stored data. One prominent hacking technique is a so-called glitch attack whereby a voltage spike is applied. This may cause transistors of an integrated circuit (IC) of the chip to switch states in an undesirable and unpredictable manner. For example, a voltage glitch applied to the supply voltage may temporarily shift the threshold voltages of the transistors or logic gates, causing the logic of the embedded central processing unit (CPU) to "skip" instructions and subsequently cause the CPU to ignore certain safety checks in the software executed by the CPU so that the hacker can take control of portions of the logic, hijack data before it is encrypted, obtain information regarding device architecture, and so on.

One common approach for detecting voltage glitches is to connect an analog detector such as a voltage sensor to the chip's voltage supply lines. However, they are not easily portable to other process nodes, such as a 16 nm FinFET process, which render the integration of analog sensor systems more difficult.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
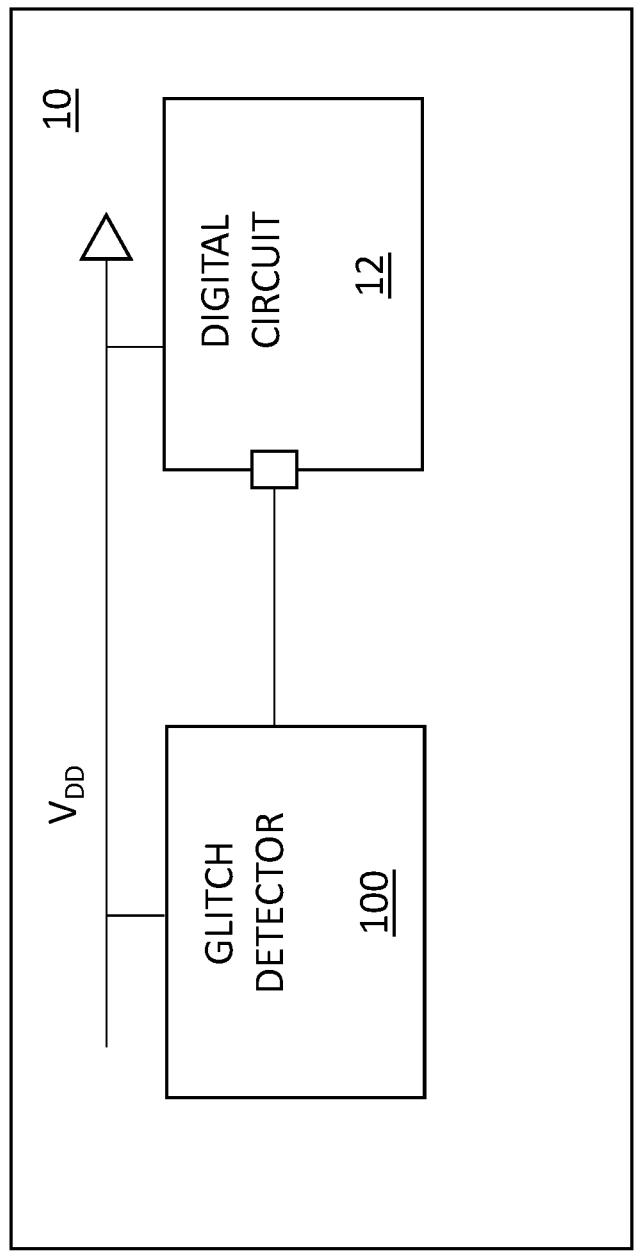
FIG. 1 is a block diagram of a computer chip, in accordance with selected embodiments of the present disclosure.

To address the abovementioned deficiencies and other drawbacks of modern glitch detectors known to those skilled in the art, embodiments of the present inventive concept include a security detection system, apparatus, and method that use standard cells in a digital core of a computer chip, or integrated circuit (IC) or the like, for providing continuous protection against voltage or related power or supply glitches. The glitch detection mechanism overcomes the problems experienced by conventional analog glitch sensors with respect to portability to other process nodes by providing a synthesizable detector constructed entirely from various electronic logic functions available in any standard cell library, and which can be applied in the digital designs of different chip types for embedding in a logic block.

In addition, the inventive security detection system, apparatus, and method provide greater scalability as well as a greater resolution over conventional glitch detection systems because a ripple counter is configured to receive a direct clock. Conventional glitch detection systems, on the other hand, typically rely on a delay line formed of inverters or buffers or related fixed delay logic elements that output a result to capture flip-flops, and arranged to compensate for unstable input signals. However, they consume valuable circuit level areas of an integrated circuit (IC). For example, a delay line can be used to determine whether a variation exists between the time when the signal should be stable and when it is actually captured, in particular, by measuring the delay of the signal traveling through the logic gates of the delay line. The delay line must be long enough to cover at least one clock cycle of the applied clock, which requires a substantial physical area of the detector. In addition, conventional delay-line based glitch detectors require a corresponding increase in the length of the delay line in order to perform glitch detection with a smaller clock frequency. For example, a clock reduction from 96 MHz to 12 MHz requires an increase in the size of a delay size by a factor of 8, which is undesirable in modern chip design where an emphasis is made on reducing logic elements. The additional logic required for the delay lines consumes valuable resources of the chip. These resources limit the chip with respect to additional scaling, clock rate increases, or other desired chip improvements.

In addition, the inventive security detection system, apparatus, and method offer an automatic adaptation to changed environmental conditions using programmable margin settings, by maintaining detection margins as small as possible and detecting glitches that are not visible as compared to conventional analog and digital glitch detection systems. In particular, typical analog glitch detection mechanisms are constructed and arranged to detect voltages above or below a threshold voltage level. The voltages levels are defined by maximum and minimum allowed supply voltage levels (plus margin). Here, a glitch having voltage below this level cannot be detected. The inventive security detection system, apparatus, and method can detect a glitch which exceeds the current reference plus/minus the margin. The related voltage level can be below/above of the levels that the analog sensor would otherwise trigger. In some embodiments, the inventive security detection system, apparatus, and method automatically adapt to temperature and voltage changes and maintain a measurement range in an optimal position to provide increased sensitivity in glitch detection.

Taking into account the degradation of a voltage glitch traveling through a computer chip due to the capacity on the power supply grid, the inventive system requires fewer glitch detectors to protect a particular security critical IC area of interest.

Accordingly, voltage glitch detectors in accordance with embodiments of the present inventive concepts can be constructed and arranged for various automotive, government, and industrial applications where security features are required, for example, a chip-based automotive hardware security engine or related security subsystem that requires on-chip security features to prevent illicit access by a hacker, who may attempt to control an operation of a vehicle via the chip.

FIG. 1 is a block diagram of a computer chip 10, in accordance with some embodiments. The chip 10 may include a set of electronic circuits such as transistors or other combinations of components formed of metal, oxide, silicon, and so on. The chip 10 may include a processor core, memory, input/output (I/O), and peripheral components (not shown) that receive a direct supply voltage from a power source such as other ICs, and can be implemented in various automotive, industrial, and consumer applications, for example, described with respect to FIG. 6 herein.

The chip 10 may include at least one supply voltage glitch detection processing system 100 and at least one digital circuit 12. The voltage glitch detection processing system 100, also referred to as a voltage glitch detector, can be embodied with the digital circuit 12 as part of a System-on-Chip (SoC) device or related computer chip in accordance with selected embodiments of the present disclosure. The digital circuit 12 may include various electronic components such as a combination of logic gates (e.g., AND, OR, and XOR gates), flip-flops, and so on available at a standard cell library. In some embodiments, the digital circuit 12 may include a post-processing section that includes an error detection system for generating an alert, event, or error signal when an undesirable glitch is detected.

The voltage glitch detection processing system 100 can likewise be formed from elements of a standard cell library. The voltage glitch detection processing system 100 is constructed and arranged to perform glitch detection functions, including filtering and removing undesirable voltage glitches with respect to input signals received by the digital circuit 12, but in a manner that allows for easy scalability to the system clock frequency as compared to a conventional glitch detector. In particular, the voltage glitch detection processing system 100 requires fewer digital logic cells forming the delay line than a conventional glitch detector while reducing the overall area of the hardware components of the voltage glitch detection processing system 100. Also, there is a reduced area dependency on the clock frequency. Delay lines offered by conventional glitch detectors, on the other hand, require a scaling of the delay line length, and therefore an increase in the detector size, linearly with the clock period. The inventive glitch detection processing system 100 only requires a scaling of the ring oscillator depending on the resolution of the detector. The area size is also reduced due to the directly clocked counter and no requirement for an initial delay line.

This reduction can also improve the resolution of glitch detection and automatically adapt to environmental conditions such as temperature changes, noise conditions, and so on because a glitch will experience less degradation traveling through the chip 10 due to the power supply grid. The voltage glitch detection processing system 100 relies on counters rather than delay lines and capture values for glitch detection, thereby requiring fewer logic components such as delay elements and offering additional advantages over conventional glitch detection systems as described herein. In some embodiments, the count values output from the ripple counter are output to a post-processing section of the IC that includes an error detection system or the like (not shown), which compares the captured count values against a computed reference value to generate an error signal if the difference between the result, i.e., count value, and the reference value exceeds a programmable and predetermined margin value. The reference is calculated based on the highest and smallest result, i.e., the count value during a given time period as determined by a programmable counter. By this the reference can be adapted to acceptable changed environmental conditions as long as the changes fall within an acceptable range, e.g., an increase in temperature. In some embodiments, the integrated circuit 10 comprises a reference adaption function, wherein the reference value is adapted in a regular time interval to an average of the count values received in a last time interval.

The abovementioned scalable resolution is achieved because the glitch detector 100 includes a ripple counter configured to receive a direct clock. A single bit added at the ripple counter and post-processing logic can double the resolution of the glitch detector. For example, the addition of a single flip-flop is required to increase the detector's resolution by a factor of 2. Conventional detectors, on the other hand, would require a doubling of the number of flip-flops for a comparable increase in resolution. Accordingly, the resolution offered by the inventive glitch detector 100 can be enhanced in a manner which ensures that there is a sufficient measurement range for all process variations of the fabrication parameters of the integrated circuit to avoid false positives.

Figure 2:
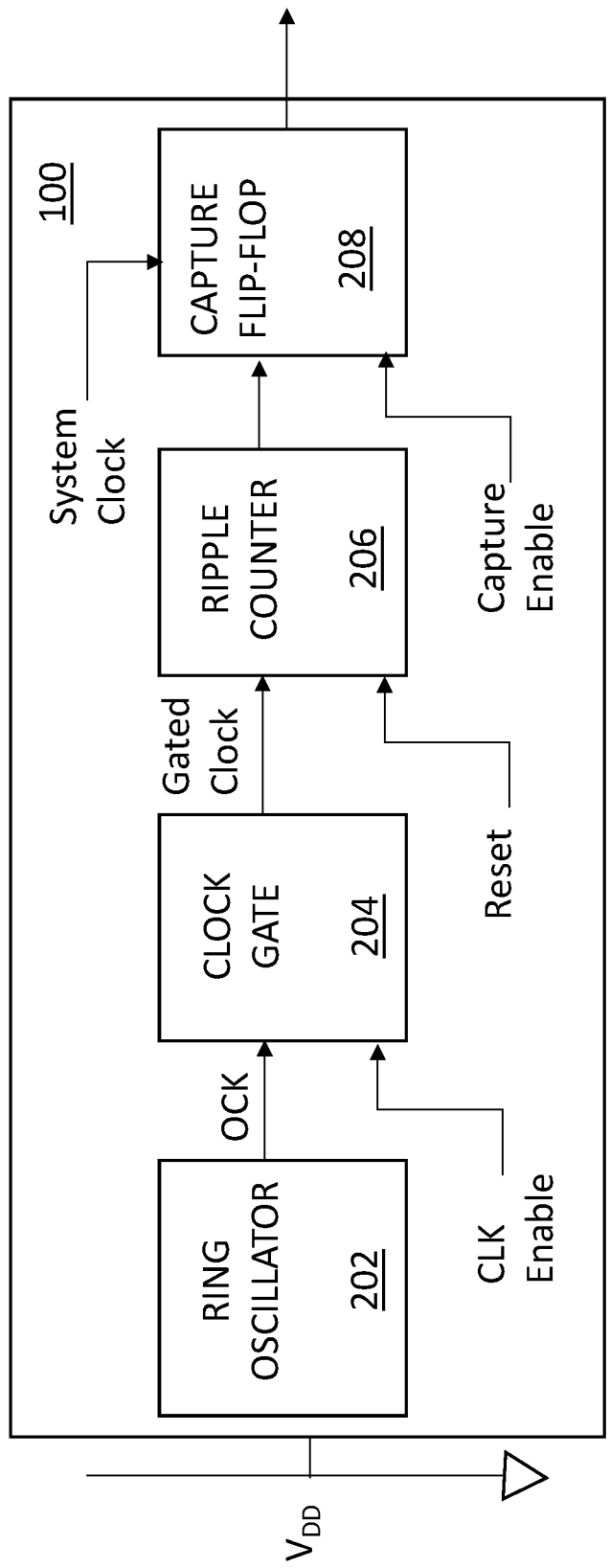
FIG. 2 is a block diagram of a voltage glitch detector, in accordance with selected embodiments of the present disclosure.

FIG. 2 is a block diagram of the voltage glitch detection processing system 100 of FIG. 1. As illustrated, in some embodiments, the voltage glitch detection processing system 100 comprises a local clock generation circuit 202, a clock gate 204, a multi-bit counter 206, and one or more capture flip-flops of a capture section 208. Although the voltage glitch detection processing system 100 is shown and described in FIG. 1 as a particular implementation, other configurations and implementations can equally apply.

In some embodiments, the local clock generation circuit 202 comprises an oscillator circuit such as a ring oscillator for clocking the counter 206. Although FIG. 2 illustrates a ripple counter 206, other counter types can equally apply. A local oscillator clock OCK is generated by the ring oscillator according to a frequency that is dependent on a supply voltage ($V_{DD}$) provided on a bus or other conduit, line, or the like to various electrical components of the computer chip 10, which may have voltage transients of which glitch detection is performed by the system 10. Accordingly, the output OCK of the ring oscillator can be used to clock the ripple counter 206 for a period of time defined by the applied system clock. The ring oscillator frequency is determined by the construction of the oscillator, for example, in turn established by a length of the ring oscillator delay chain. The propagation delay in the ring oscillator circuit 202 is output as a function of the supply voltage ($V_{DD}$).

The clock gate 204 is constructed and arranged to stop, or gate, the local oscillator clock OCK to allow a count value output from the ripple counter 206 to settle before being captured into the clock domain of the outer system, or synchronize, since the value may not settle to a stable value in a single clock cycle. The value has a direct relationship with the supply voltage, especially if considered in a regular manner according to a fixed time frame defined on the basis of the system clock. In some embodiments, the clock gate 204 includes an enable input (CLK Enable) provided by clock enable logic input to an AND gate or the like that controls the clock, for example, by gating the output so that no clock is output during predetermined periods of the synchronization process, and thereby controlling when the counter 206 increments its value. The foregoing illustrates one possible synchronization technique, but not limited thereto.

In addition, the clock gate 204 can reduce power consumption of the device while also allowing a count value output from the ripple counter 206 to settle.

The ripple counter 206 is constructed and arranged to receive a gated clock signal directly from the clock gate 204. As previously mentioned, the ripple counter 206 is clocked by a ring oscillator 202 or the like. Due to the supply voltage dependence by the ring oscillator 202, the count value in the ripple counter 206 will have a direct relationship with the supply voltage ($V_{DD}$) when the oscillator clock OCK clocks the ripple counter 206 for a predetermined period of time defined by the system clock, which in turn is generated in a regular manner based on the fixed time frame, i.e., defined by the period of the clock used in the system the voltage glitch detection processing system 100 is designed to protect. The ripple counter 206 has a reset input for clearing a count value to zero. More specifically, the ring oscillator output is used to clock the ripple counter 206 for a certain period of time defined by the applied system clock having a static clock frequency. After each period, the current value of the counter 206 is captured, the counter 206 is reset to establish a new period.

The capture section 208 includes one or more capture flip-flops constructed and arranged to synchronize a bit level signal, and more specifically, to capture the count values output from the ripple counter 206 with the system clock domain as part of a synchronization process. The output of the capture section 208 can be provided to post-processing section of the IC, or an external error correction device or the like that is in communication with the chip 10.

The underlying concept of this invention is to use the subsequent values of one or more counters clocked by a voltage dependent clock source, e.g. a ring oscillator clock, sample them in a fixed time frame, e.g. defined by the system clock and to compare the subsequent values against each other's by generating a reference value from the count values. As described herein, a feature of the present inventive concept is to compare voltage dependent count values captured in a regular time interval defined by the system clock. A reference is calculated from the count values. If a count value exceeds the reference plus a particular margin, then an error signal is generated. The use of two clock sources for clocking the counters and generating the time reference requires a so-called clock domain crossing between those. One such concept is described as follows.

Figure 3:
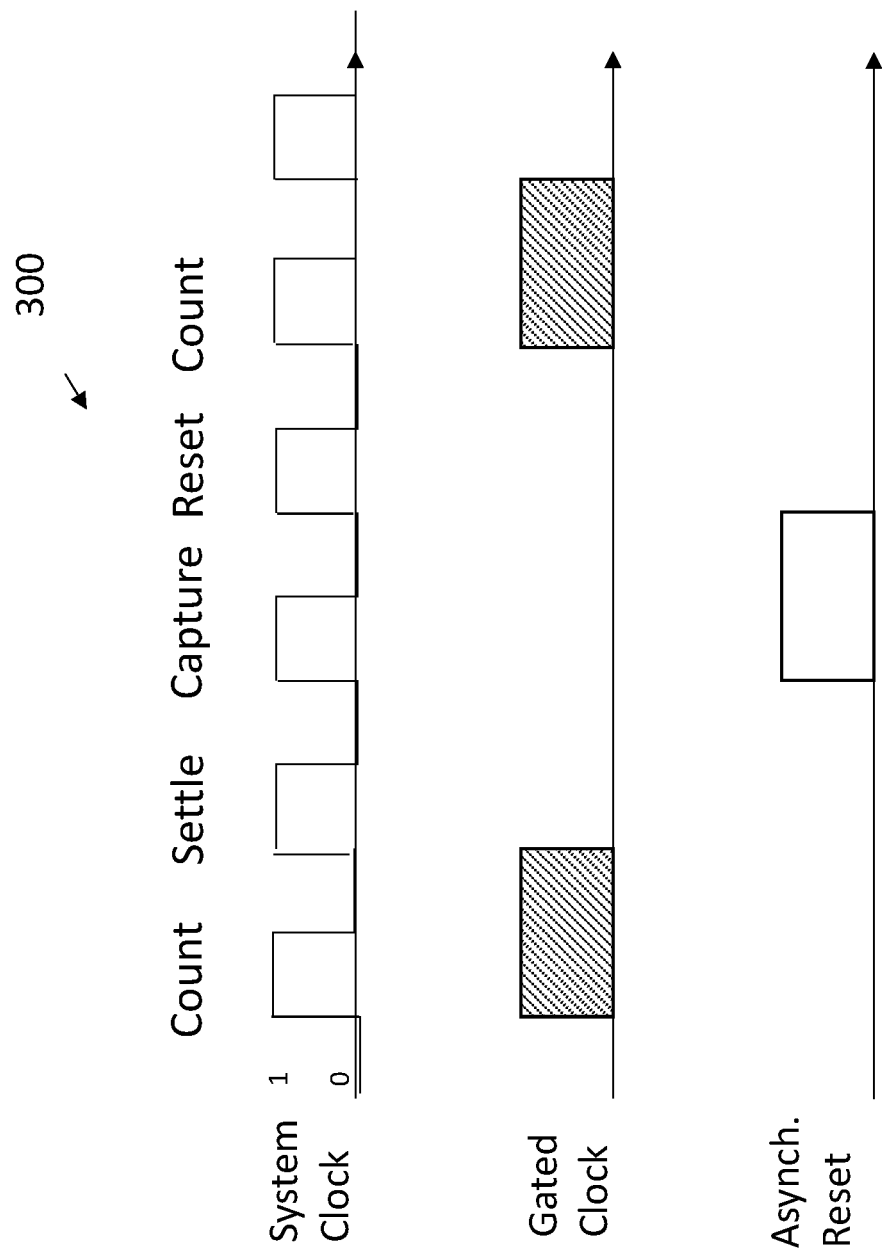
FIG. 3 is a set of timing waveforms illustrating different phases of a synchronization process performed by the voltage glitch detector of FIGS. 1 and 2, in accordance with selected embodiments of the present disclosure.

For an improved understanding of the operation of a voltage glitch detector described in FIGS. 1 and 2, reference is now made to FIG. 3 which illustrates a timing diagram 300 of relevant input and output signals from the voltage glitch detector 100.

As shown in FIG. 3, a system clock is provided having a predetermined fixed frequency. As previously described, the result, or output of the counter 206, is directly dependent on the supply voltage during the last measurement period, defined by the period the clock gate 204 is open and the clock of the ring oscillator passes through to the ripple counter. The measurement period is defined by the system clock. Depending on the frequency relation of the ring oscillator and the system clock some embodiments might use a measurement period of one system clock cycles other embodiments might use more system clock cycles. The number of the ring oscillator clocks in a selected measurement period defines the possible resolution of the detector. The ripple counter 206 increments a stored count value on the clock edge of the gated clock signal. In some embodiments, the gated clock output from the clock gate 204 is provided at the rising edge of the count pulse, and is applied to the count pulse to synchronize the counter value into the clock domain of the system. The clock from the ring oscillator 202 passing through the clock gate 204 is applied to the counter 206. This will count as long the clock gate 204 is open. The settle, capture, and result phases of the synchronization process follow the count phase, but unlike the count pulse, are not dependent on the supply voltage, and therefore not susceptible to glitches in the supply voltage. In particular, during synchronization the clock of the ripple counter 206 must be stopped to allow the count value to settle. After the settling period the count value is captured into the system clock domain. Subsequently, the ripple counter 206 is reset, e.g., an asynchronous reset as shown in FIG. 3.

Since glitch detection is not performed with respect to the clock pulses of the settle, capture, and reset phases respectively, it follows that glitch detection does not occur in every system clock cycle. However, turning to FIGS. 4 and 5, a plurality of ripple counters can be constructed and arranged to allow a voltage glitch detection processing system to generate a continuous glitch detection in each clock cycle, and which allow count values to be held in the various stages of the counting and synchronization processes.

Figure 4:
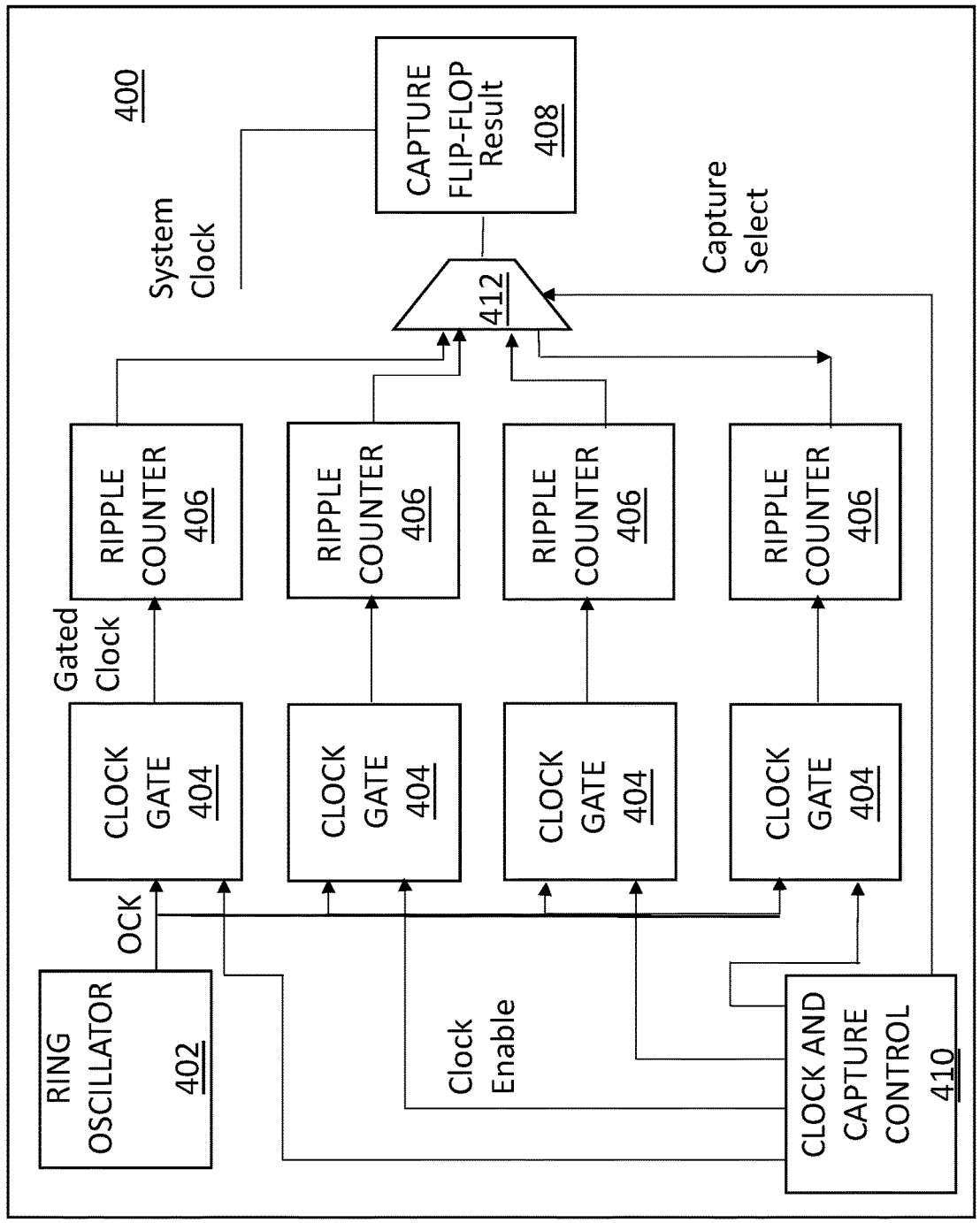
FIG. 4 is a block diagram of another voltage glitch detection processing system, in accordance with selected embodiments of the present disclosure.

Referring to FIG. 4, a circuit diagram of a voltage glitch detection processing system 400, in accordance with selected embodiments is described. At least some elements of the voltage glitch detector 400 are the same or similar to those described with respect to the voltage glitch detection processing system 100, thus are not repeated for brevity.

A clock gate 404A-404D (generally, 404) comprises a plurality of logic gates, for example, AND gates. Each clock gate 404 has an output coupled to a ripple counter 406. Each clock gate 404 has a first input constructed and arranged to receive a local oscillator clock OCK from a ring oscillator 402 and a second input for receiving a related clock enable signal from a clock and capture control module 410.

Figure 5:
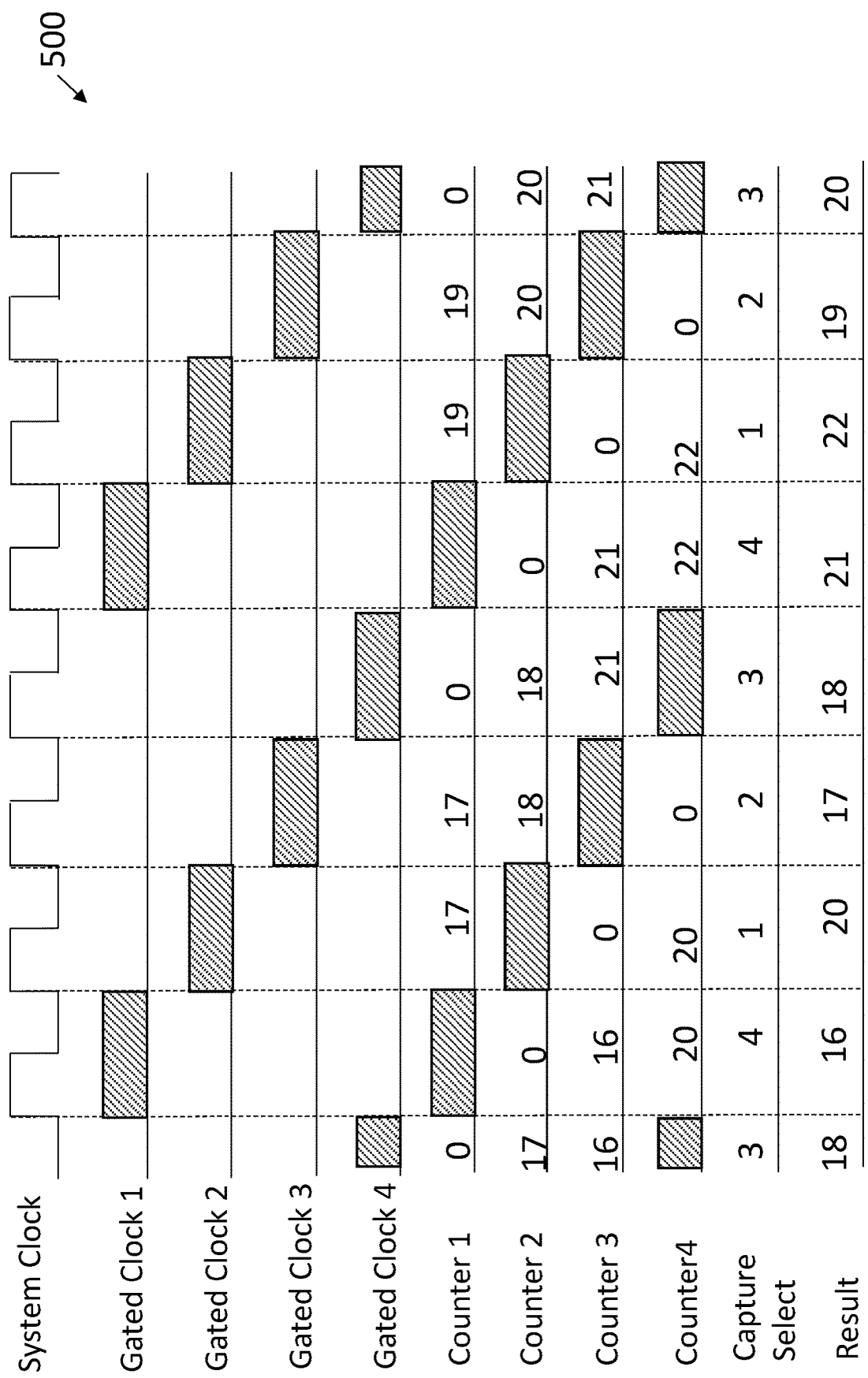
FIG. 5 is a set of timing waveforms illustrating different phases of a synchronization process of the voltage glitch detector of FIG. 4, in accordance with selected embodiments of the present disclosure.

The clock and capture control module 510 is constructed and arranged to communicate with the clock gates 404 and a selection circuit 412 such as a multiplexer or the like. By means of the clock enable and capture select signal the selection circuit 412 will control the clock gates in a way that the clock from the ring oscillator 402 is applied to only one of the ripple counters 406 at a time and that with every system clock the count value from one ripple counter 406 is captured. FIG. 5 shows the related timing diagram 500. In particular, the timing diagram 500 shows the shifted behavior of the four parallel clock gates 404 and ripple counters 406 pairs with the shifted measurement, settle capture and reset phases. The values shown in the diagram are example values to assist in the understanding which count value is being taken over into the capture flip-flops, 408 referred to herein as Result. The capture select value defines the counter 406 from which the value is taken over into the Result in the next rising clock edge. E.g. if Capture select is 1, the value from counter 1 is taken over into the Result.

As described above, the output of a voltage glitch detection processing system can be provided to post-processing section of the chip 10, e.g., post-processing section of digital circuit 12, or to an external error correction device or the like that is in communication with the chip 10. The post-processing section can evaluate this output by comparing the ripple counter value against a reference value. In particular, the synchronized count value is compared to the reference value, which in turn is calculated from prior count values. In some embodiments, the reference value may be a fixed value. In other embodiments, as described below, the reference value may be a variable value.

If the difference between reference value and result is bigger than a programmable positive margin or smaller than a programmable negative margin then an error is raised. The programmable margin settings allow the voltage glitch detection processing system to adapt the different kind of noise profiles on different chips and applications and to assure an optimum detection rate for glitches while avoiding false positives or negatives. In some embodiments, this is achieved by the inventive security detection system, apparatus, and method allowing a continuous glitch detection operation to be performed in every system clock cycle, illustrated for example in FIGS. 4 and 5.

Also, digital post-processing can be performed to remove the impact of temperature and slow supply voltage changes on the result the reference value is regularly adapted to the measured result. The update rate can be programmed via a timer setting. An update timer (not shown) can be provided that generates a periodic timing reference signal for updating the reference value.

For each timer period the highest and lowest measurement result (minimum/maximum) is determined. An average of the maximum and minimum measurement result can be used for the reference value. At the end of the timer period the reference is averaged with these values with a programmable weight. Having the weight of reference programmable, allows to suppress big changes in the reference value due to changes in the supply noise due to changes in the application. Accordingly, the system can offer an automatic adaptation to changed environmental conditions using programmable margin settings, by maintaining detection margins as small as possible and detecting glitches that are not visible as compared to conventional analog and digital glitch detection systems. In addition, the inventive security detection system, apparatus, and method can automatically compensate for temperature changes.

As described herein, embodiments of the inventive concept detect voltage glitches by comparing consecutive count values clocked by a ring oscillator that is dependent on a supply voltage. The subsequently generated count value may also depend on the frequency of the system clock as this determines the length of the measurement period. Accordingly, in some embodiments, the system is constructed and arranged to operate as a frequency monitor without additional structural requirements or changes.

Figure 6:
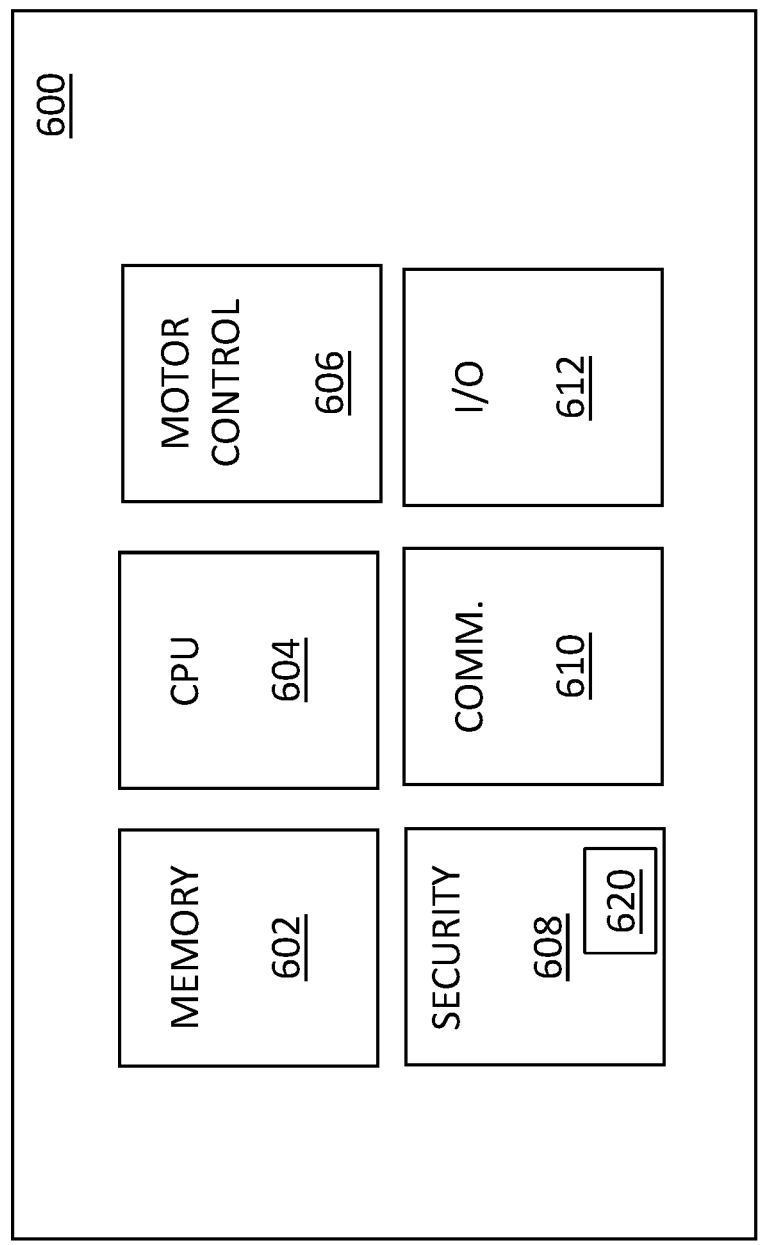
FIG. 6 is a block diagram of an automotive microcontroller including a voltage glitch detector, in accordance with selected embodiments of the present disclosure.

FIG. 6 is a block diagram of an automotive microcontroller 600 including a voltage glitch detector 620, in accordance with selected embodiments of the present disclosure. The automotive microcontroller 600 may be implemented for various automobile functions including but not limited to automotive radar systems, braking and stability control, electric power steering (EPS), hybrid and electric vehicle power inverter, powertrain, converter and charger. Although shown in FIG. 6 as part of an automotive chip, the voltage glitch detector 620 can apply to any chip which requires a protection against supply voltage glitching and which contains a synthesized digital logic section. In general, all security related chips, integrated circuits, or the like may include features of the present invention, for example, quantum technologies implemented in radio chips provided by the Institute of Defense Analysis (IDA) or other security protection mechanisms.

The voltage glitch detector 620 may be the same as or similar to voltage glitch detectors 100, 400 described in FIGS. 1-5, respectively. The voltage glitch detector 620 may be part of a security system 608 and communicate with other elements of the automotive microcontroller 600 on a chip, including but not limited to a memory 602, CPU 604, motor control system 606, security system 608, serial communications 610, and input/output (I/O). The security system 608 in particular is constructed and arranged to provide safety functionality and fault recovery that detects, isolates, and resolves computer faults without system shutdown. The security system 608 executing the voltage glitch detector 620 can provide protection against malicious hacking.

Figure 7:
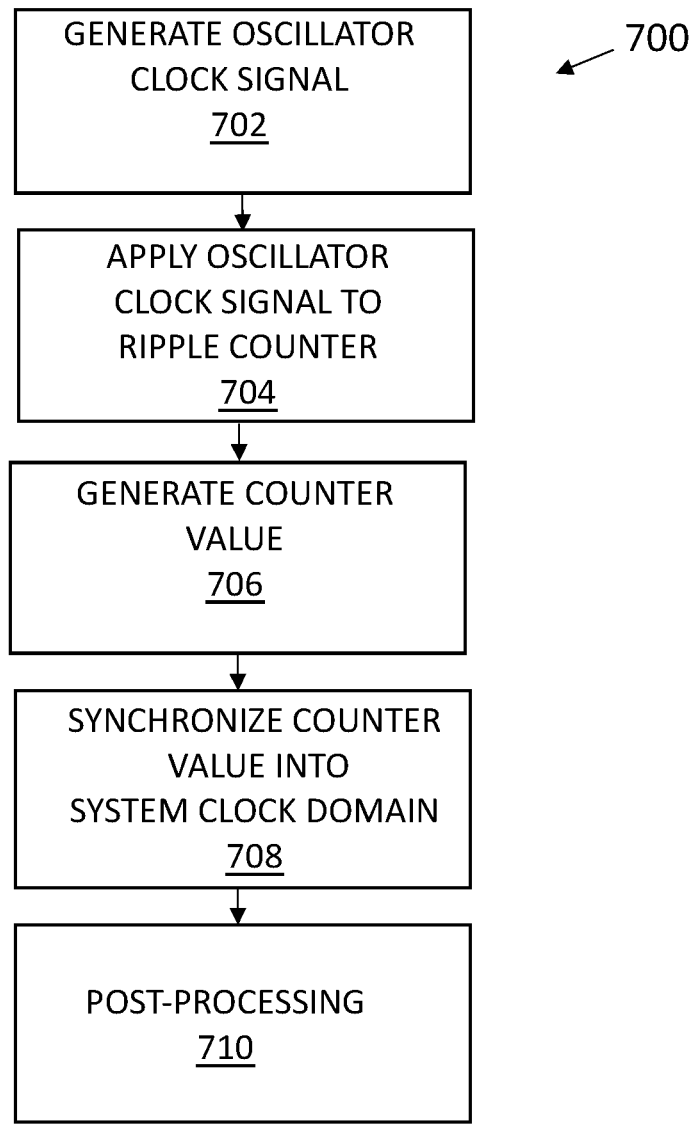
FIG. 7 is a flowchart illustrating a method for detecting and preventing glitch attacks on a data processing system, in accordance with selected embodiments of the present disclosure.

FIG. 7 is a flowchart illustrating a method 700 for detecting and preventing glitch attacks on a data processing system, in accordance with selected embodiments of the present disclosure. Some or all of the method 700 can be performed in a computer chip described in embodiments herein, for example, performed by a glitch detector hardware engine that is connected to the supply lines in an appropriate way.

At block 702, an oscillator clock signal is generated that has a frequency that is dependent on the supply voltage of the circuit of interest.

At block 704, the oscillator clock signal is used to clock a counter for a predetermined amount of time defined by the applied system clock. In some embodiments, the counter is a ripple counter. Other embodiments may include other counter types.

At block 706, the counter generates a counter value. Due to the supply voltage dependency of the ring oscillator frequency the value in the ripple counter has a direct relationship with the voltage if evaluated in a regular manner based on a fixed time frame. The fixed time frame is defined by the period of the clock used in the system the detector shall protect.

At block 708, the ripple counter value is synchronized into the system clock domain. In doing so, the oscillator clock may be stopped to allow the value to settle. After settling, the value can be captured into the system clock domain.

At block 710, the foregoing is provided to a post-processing computer, such as digital circuit 12 of FIG. 1.

As will be appreciated, embodiments as disclosed include at least the following embodiments. In one embodiment, an integrated circuit for hardware security comprises a voltage glitch detection processing system comprising an oscillator circuit that generates and outputs a local oscillator clock, which is a function of a supply voltage; and a counter clocked by the ring oscillator to generate at least one count value; and a capture section that synchronizes the at least one count value into a system clock domain for detecting a voltage glitch in the supply voltage.

Alternative embodiments of the integrated circuit for hardware security include one of the following features, or any combination thereof.

The voltage glitch detection processing system further comprises a clock gate that generates a gated clock from the local oscillator clock to control a receipt by the ripple counter of the local oscillator clock.

The capture section synchronizes the count value into the system clock domain after a settling period of the count value in response to the gated clock.

The local oscillator clock is stopped to allow the count value to settle in the settling period.

The ripple counter has a reset input for clearing the at least one count value to zero.

After each period, a current value of the at least one count value of the counter is captured, and the counter is reset to establish a new period.

The counter increments the at least one count value on a clock edge of the gated clock and the gated clock is output from the clock gate is provided at the rising edge of a count pulse, and is applied to the count pulse.

The at least one counter value is directly dependent on the supply voltage during a measurement period when the clock gate is open and the local oscillator clock passes through the clock gate to the counter, and a resolution of the voltage glitch detection processing system is determined by a number of ring oscillator clocks in the measurement period.

The integrated circuit further comprises an error detection system, wherein the at least one count value is output from the counter to the error detection system, which to generates an error signal when the at least one count value is different than a reference value by a predetermined margin.

The integrated circuit further comprises a reference adaption function, wherein the reference value is adapted in a regular time interval to an average of the count values received in a last time interval.

The integrated circuit further comprises a plurality of clock gates, each of the clock gates generating a gated clock to a counter of a plurality of counters in parallel with the clock gates, which generate a continuous glitch detection in each clock cycle of a system clock.

The integrated circuit further comprises a clock and capture control module that outputs a clock enable signal to the clock gates so that the gated clock in response to the local oscillator clock is applied to only one of the counters at a time.

The clock gates are logic AND gates, each having a first input for receiving the local oscillator clock from the ring oscillator and a second input for receiving the clock enable signal from the clock and capture control module.

The integrated circuit further comprises a selector that controls an output of the counters so that one count value at a time is captured by the capture section.

In one embodiment, a voltage glitch detection processing system for a System-on-Chip (SoC) device, comprises an oscillator circuit that generates and outputs a local oscillator clock, which is a function of a supply voltage; and a counter clocked by the ring oscillator to generate at least one count value that are synchronized with a system clock to detect a voltage glitch in the supply voltage.

Alternative embodiments of the voltage glitch detection processing system include one of the following features, or any combination thereof.

The voltage glitch detection processing system further comprises a clock gate (204) that controls the local oscillator clock to allow the at least one count value output from the counter to settle prior to being captured into a domain of the system clock such that the clock value has a direct relationship with the supply voltage.

The at least one count value of the counter is clocked by the local oscillator clock, sampled in a fixed time frame defined by the system clock, and compared to subsequent count values.

The voltage glitch detection processing system further comprises a plurality of clock gates, each of the clock gates generating a gated clock to a counter of a plurality of counters in parallel with the clock gates, which generate a continuous glitch detection in each clock cycle of a system clock.

The system is constructed and arranged to operate as a frequency monitor.

In one embodiment, a method for detecting a supply voltage glitch attack at a hardware security integrated circuit comprises: generating a first clock as a function of a supply voltage; generating a count value in response to the first clock; and synchronizing the count value into a second clock domain to detect a voltage glitch in the supply voltage.

Alternative embodiments of the voltage glitch detection processing system include one of the following features, or any combination thereof.

The first clock is a local oscillator clock and the second clock is a system clock.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An integrated circuit for hardware security, comprising:
a voltage glitch detection processing system, comprising:
   an oscillator circuit configured to generate and output a local oscillator clock as a function of a supply voltage;
   a plurality of clock gates, wherein each clock gate is configured to receive the local oscillator clock and, in response to a clock enable signal, generate a gated clock;
   a plurality of counters, wherein each counter corresponds to a unique clock gate in the plurality of clock gates and is configured to receive the corresponding gated clock and generate at least one count value;
   a selector logic circuit configured to receive the at least one count values from the plurality of counters and output, based on a control signal, a particular at least one count value associated with a particular counter;
   a capture section configured to synchronize the particular at least one count value into a system clock domain for detecting a voltage glitch in the supply voltage; and
   a controller configured to:
      generate the clock enable signal, such that a single clock gate of the plurality of clock gates generates the gated clock signal at a time, and
      generate the control signal, such that the selector logic circuit outputs the particular at least one count value.

2. The integrated circuit of claim 1, wherein the capture section synchronizes the particular at least one count value into the system clock domain after a settling period of the particular at least one count value in response to the gated clock.

3. The integrated circuit of claim 2, wherein the local oscillator clock is stopped to allow the count value to settle in the settling period.

4. The integrated circuit of claim 3, wherein each counter in the plurality of counters has a reset input for clearing the at least one count value to zero.

5. The integrated circuit of claim 4, wherein after each period, a current value of the at least one count value of the particular counter is captured, and the particular counter is reset to establish a new period.

6. The integrated circuit of claim 1, wherein the particular counter increments the particular at least one count value on a clock edge of the gated clock and the gated clock is provided at the rising edge of a count pulse.

7. The integrated circuit of claim 1, wherein the particular at least one count value is directly dependent on the supply voltage during a measurement period while the clock gate is open and the local oscillator clock passes through the clock gate to the particular counter, and wherein a resolution of the voltage glitch detection processing system is determined by a number of oscillator clocks in the measurement period.

8. The integrated circuit of claim 1, further comprising an error detection system, wherein the particular at least one count value is output from the particular counter to the error detection system, wherein the error detection system is configured to generate an error signal in response to the particular at least one count value being different than a reference value by a predetermined margin.

9. The integrated circuit of claim 8, further comprising a reference adaption function, wherein the reference value is adapted in a regular time interval to an average of the count values received in a last time interval.

10. The integrated circuit of claim 1, wherein the plurality of clock gates are logic AND gates, each logic AND gate having a first input for receiving the local oscillator clock from the oscillator circuit and a second input for receiving the clock enable signal from the controller.

11. A voltage glitch detection processing system for a System-on-Chip device, comprising:
an oscillator circuit configured to generate and output a local oscillator clock as a function of a supply voltage;
a plurality of counters clocked by the oscillator circuit, wherein each counter in the plurality of counters is configured to generate at least one count value; and
a selector logic circuit configured to receive the at least one count values from the plurality of counters and output a particular at least one count value associated with a particular counter, wherein the particular at least one count value is synchronized with a system clock to detect a voltage glitch in the supply voltage.

12. The voltage glitch detection processing system of claim 11, further comprising a plurality of clock gates, wherein each clock gate corresponds to a unique counter in the plurality of counters, wherein each clock gate is configured to control the local oscillator clock to allow an at least one count value output from the corresponding counter to settle prior to being captured into a domain of the system clock.

13. The voltage glitch detection processing system of claim 11, wherein the particular at least one count value of the particular counter is clocked by the local oscillator clock, sampled in a fixed time frame defined by the system clock, and compared to subsequent count values.

14. The voltage glitch detection processing system of claim 11, wherein each of the clock gates is configured to generate a gated clock signal, which generate a continuous glitch detection in each clock cycle of the system clock.

15. The voltage glitch detection processing system of claim 11, wherein the system is constructed and arranged to operate as a frequency monitor.

16. A method for detecting a supply voltage glitch attack at a hardware security integrated circuit, comprising:
generating a first clock as a function of a supply voltage;
generating, by a particular counter in a plurality of counters, a count value in response to the first clock;
selecting, by a selector logic circuit, the count value from the particular counter; and
synchronizing the count value from the particular counter into a second clock domain to detect a voltage glitch in the supply voltage.

17. The voltage glitch detection processing system of claim 11, further comprising an error detection system configured to generate an error signal in response to the synchronized count value being different than a reference value by a predetermined margin.

18. The voltage glitch detection processing system of claim 17, further comprising a reference adaption module configured to update, in a regular time interval, the reference value based on an average of the count value in a prior time interval.

19. The method of claim 16, further comprising gating, by a particular clock gate in a plurality of clock gates, the first clock to obtain a gated clock, wherein generating the count value in response to the first clock comprises generating the count value in response the gated clock, wherein each clock gate in the plurality of clock gates corresponds to a unique counter in the plurality of counters, and wherein the particular clock gate corresponds to the particular counter.

20. The method of claim 17, further comprising:
determining, by an error detection system, that the synchronized count value differs from a reference value by a predetermined margin; and
generating, by the error detection system and in response to the determination, an error signal.

* * * * *